United States Patent
Stevenson et al.

(10) Patent No.: US 6,782,063 B1
(45) Date of Patent: Aug. 24, 2004

(54) AUTOMATIC GAIN CONTROL

(75) Inventors: J. Mark Stevenson, San Diego, CA (US); Susan G. Briest, San Diego, CA (US); Jack R. Olson, San Diego, CA (US); Alan Fronk, Oceanside, CA (US); Vincent K. McDonald, San Diego, CA (US); Christopher L. Fletcher, San Diego, CA (US); William H. Marn, San Diego, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 739 days.

(21) Appl. No.: 09/659,853

(22) Filed: Sep. 12, 2000

(51) Int. Cl.[7] .............................................. H04L 27/08
(52) U.S. Cl. .................. 375/345; 455/234.1; 455/234.2
(58) Field of Search ................................. 375/345, 316; 455/232.1, 234.1, 234.2

(56) References Cited

U.S. PATENT DOCUMENTS 5,425,000 A * 6/1995 Reed et al. .................. 367/131
5,917,372 A * 6/1999 Kakura et al. .............. 330/129

* cited by examiner

Primary Examiner—Young T. Tse
Assistant Examiner—David B. Lugo
(74) Attorney, Agent, or Firm—Andrew J. Cameron; Michael A. Kagan; Peter A. Lipovsky

(57) ABSTRACT

The invention provides an automatic gain control system that is implemented by digital hardware. The digital hardware determines the range of a set of digital data values, and then examines each digital data value in a sequence. An index counter increments a sample count index i each time a new digital data value is examined and determines the absolute value of the $i^{th}$ digital data value. The digital hardware also counts both the number j of digital data values that exceed a high percentage value of the range, and the number k of digital data values that are less than a low percentage value of the range as the digital hardware runs through the sequence. If the digital hardware determines that a digital data value is greater than the high percentage value, the ratio j/i exceeds a first threshold value, and the gain level is not set to the lowest gain level, then the gain is decreased. If the digital hardware determines that a digital data value is less than the low percentage value, the ratio k/i exceeds a second threshold value, a predetermined interval of time has elapsed, and the gain level is not set to the highest gain level, then the gain is increased.

11 Claims, 2 Drawing Sheets

AUTOMATIC GAIN CONTROL

BACKGROUND OF THE INVENTION

The present invention generally relates to a system for effectuating automatic gain control of signals which may have a large dynamic range, and more particularly to a system that examines an array of digital signal values to determine the appropriate amount of signal gain based on the range of signal values and the percentage of any signal values from that fall both above and below the bounds of a signal value domain.

Automatic gain control techniques are reluctantly used in underwater hydrophone arrays because of their notorious reputation for oscillatory behavior. The problem of robust gain control in autonomous systems involves balancing efficient use of the information channel against the possible loss of data. For example, a short transient tends to destabilize autonomous systems. Therefore, a need exists for a stable automatic gain control system having a large dynamic range, but which tends to remain at a particular gain setting in the presence of transient signals.

SUMMARY OF THE INVENTION

The present invention provides an automatic gain control system that may be implemented in digital hardware. The digital hardware processes an algorithm that determines whether or not to change gain settings. An important feature of the invention is that gain increases are only effectuated if a predetermined time interval has expired after initialization of an interval timer. The digital hardware determines the range of a set of digital data values, and then examines each digital data value in a sequence. An index counter increments a sample count index i each time a new digital data value is examined and determines the absolute value of the $i^{th}$ digital data value. The digital hardware also counts both the number j of digital data values that exceed a high percentage value of the range, and the number k of digital data values that are less than a low percentage value of the range as the digital hardware runs through the sequence. If the digital hardware determines that a digital data value is greater than the high percentage value, the ratio j/i exceeds a first threshold value, and the gain level is not set to the lowest gain level, then the gain is decreased. If the digital hardware determines that a digital data value is less than the low percentage value, the ratio k/i exceeds a second threshold value, a predetermined time interval has elapsed since the initialization of a timer, and the gain level is not set to the highest gain level, then the gain is increased.

An important advantage of the invention is that it provides automatic gain control that is relatively stable because transient data do not necessarily result in gain level changes. The simplicity of the algorithm processed by the invention makes hardware implementation feasible. These and other advantages of the invention will become more apparent upon review of the accompanying drawings and specification, including the claims.

BRIEF DESCRIPTION OF THE DRAWINGS

Throughout the several views, like elements are referenced using like references.

DESCRIPTION OF THE PREFERRED EMBODIMENT

Figure 1:
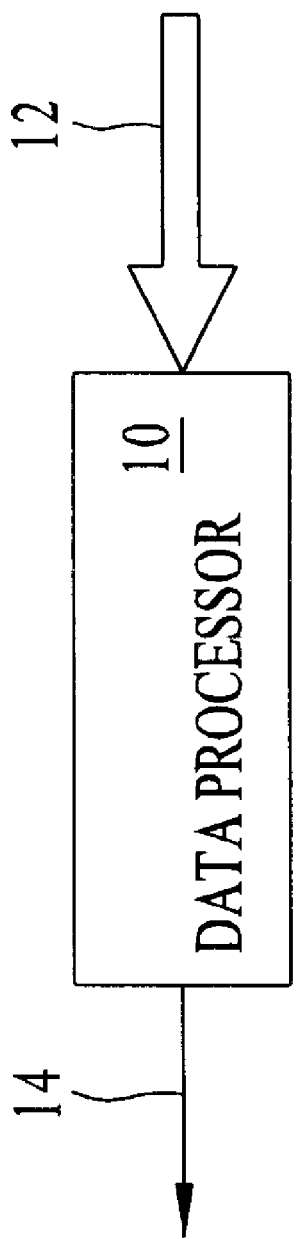
FIG. 1 illustrates a block diagram of the present invention.

The present invention provides a system for effectuating automatic gain control of signals which may have a large dynamic range by examining an array of digital signal values to determine the appropriate amount of signal gain based on the range of signal values and the percentage of any signal values from that fall both above and below the bounds of a signal value domain. Referring to FIG. 1, system 10 includes digital hardware 10 such as a programmable logic device (PLD), computer, and the like. Digital hardware 10 applies an algorithm 18 (FIG. 2) implemented internally in hardware to digitized data 12 provided from a data source, not shown, such as a computer or other type of signal generating device. Such a signal-generating device may include a sensor that generates an analog signal that is converted to a digital signal. Digital hardware 10 generates a gain control signal 14, based on the outcome of algorithm 18 that determines whether gain control level signal 14 will be modified to represent a gain increase or decrease, or remain at a constant level.

Algorithm 18, described with reference to FIG. 2, starts at step 20 and proceeds to step 22 where a timer counter is initialized at a count of "1." At step 24, the gain is set to a predetermined level. Next, at step 26, index x is initialized. Index x is used to designate a particular array $A_x$ of a group of arrays $A_1, A_2, A_3, \ldots A_m$, where x and m are integers and $1 \leq x \leq m$. Each array $A_x$ includes an n number of digital data values $V_{(x,1)}, V(x,_2), V_{(x,3)}, \ldots V_{(x,n)}$, where i is a sample count index, n is an integer and $1 \leq i \leq n$. High and low limit counters are initialized at step 27. The high limit counter employs an integer index j that represents the number of digital data values $V_{(x,l)}, \ldots V_{(x,i)}$ that exceed a high percentage limit, as for example, 95%, of the range of digital data values $V_{(x,1)}, V_{(x,2)}, V_{(x,3)}, \ldots V_{(x,n)}$, where the range is defined as the difference between the digital data values having the highest and lowest values. For example, if the highest and lowest of the values of the digital values are 12 and 5, then the range is 7. However, it is to be understood that the high percent limit may be set at any other value required to suit the needs of a particular application. The low limit counter employs an integer index k that represents the number of digital data values that have been read by algorithm 18 that are less than a low percent limit, as for example, 5%, of the range of digital data values $V_{(x,1)}, V_{(x,2)}, V_{(x,3)}, \ldots V_{(x,n)}$.

At step 28, sample counter index i is set to "1." Then digital hardware 10 reads digital values $V_{(x,1)}, V_{(x,2)}, V_{(x,3)}, \ldots V_{(x,n)}$ at step 30. Step 32 determines if the sign bit for $V_{(x,i)}$ is set at step 32. The presence of the sign bit represents a negative number. If the sign bit is not set, $V_{(x,i)} \geq 0$ and a determination is made at step 34 as whether the magnitude of the data sample $V_{(x,i)}$ is greater than the high percent limit, such as 95%, of the range or full scale value of all digital data values $V_{(x,i)}, V_{(x,2)}, V_{(x,3)}, \ldots V_{(x,n)}$ previously read at step 30. However, if the sign bit is set, at step 36, the sign bit is removed and the value of $V_{(x,i)}$ is inverted, whereupon the algorithm continues to step 34. Step 36 essentially has the effect of taking the absolute value of $V_{(x,i)}$.

If the determination at step 34 is NO, then a decision is made at step 38 as to whether the magnitude of $V_{(x,i)}$ (the sample) is less than 5% of the range of all digital data values read at step 30. If the determination at step 38 is YES, then the low limit counter index k is incremented. After the low limit counter k is incremented at step 40, step 42 determines if the interval timer has reached a clock count representing a predetermined period or elapsed time, as for example 90 seconds, or any other suitable period, since the interval timer was initialized. If the decision at step 42 is NO, algorithm 18 continues to step 44 which increments the sample count index i, and then returns to step 30. If the determination at step 38 is then algorithm 18 continues to step 42.

If the determination at step 34 is YES, i.e., that the sample $V_{(x,i)}$ is greater than the high percent limit of 95% of the range, then the high Limit counter index j is incremented at step 46. Next, step 48 determines if j/i>0.01, where 0.01 represents a first threshold value. It is to be understood that the first threshold value may also be a number other than 0.01, as required to suit the needs of a particular application.

If the outcome at step 48 is that j/i>0.01%, then step 50 determines if the gain is set to the lowest possible gain that the hardware environment (not shown) is capable of attaining. If the decision at step 48 is that j/i≦0.01%, algorithm 18 continues to step 42, described above. If the determination at step 50 is YES, algorithm 18 continues to step 42. If, however, the determination at step 50 is NO, i.e., the gain is not set to the lowest possible level, then step 54 generates signal 14, whereby signal 14 has a quality that causes a decreases decrease in the gain level of a device, not shown.

Next, algorithm 18 proceeds to step 56 which determines if x=m. If the decision at step 56 is that x≠m, then step 58 increments x. The algorithm then returns to step 27. If the determination at step 56 is that x=m, algorithm 18 returns to step 26.

If the decision at step 42 is that the interval timer has reached a predetermined count, as for example, a count that corresponds to 90 seconds, then at step 60 the interval timer is reset to "1." Next, step 62 determines if the ratio k/i is greater than a second threshold value, such as 5%. If k/i is greater than the second threshold value, then step 64 determines if the gain level control is set to represent the highest gain. If the determination at step 64 is NO, then at step 68, the quality of gain level output signal 14 is changed so as to cause an increase in the gain level, and algorithm 18 continues to step 56, described above. Waiting until the interval timer reaches a predetermined time limit, as determined at step 42, before the gain is allowed to be increased adds hysteresis to the system, thereby preventing gain change oscillations. If, however, the decision at step 64 is that the gain command signal represents the highest gain level that the system is capable of achieving, then no gain change is warranted and algorithm 18 continues to step 56.

Figure 2:
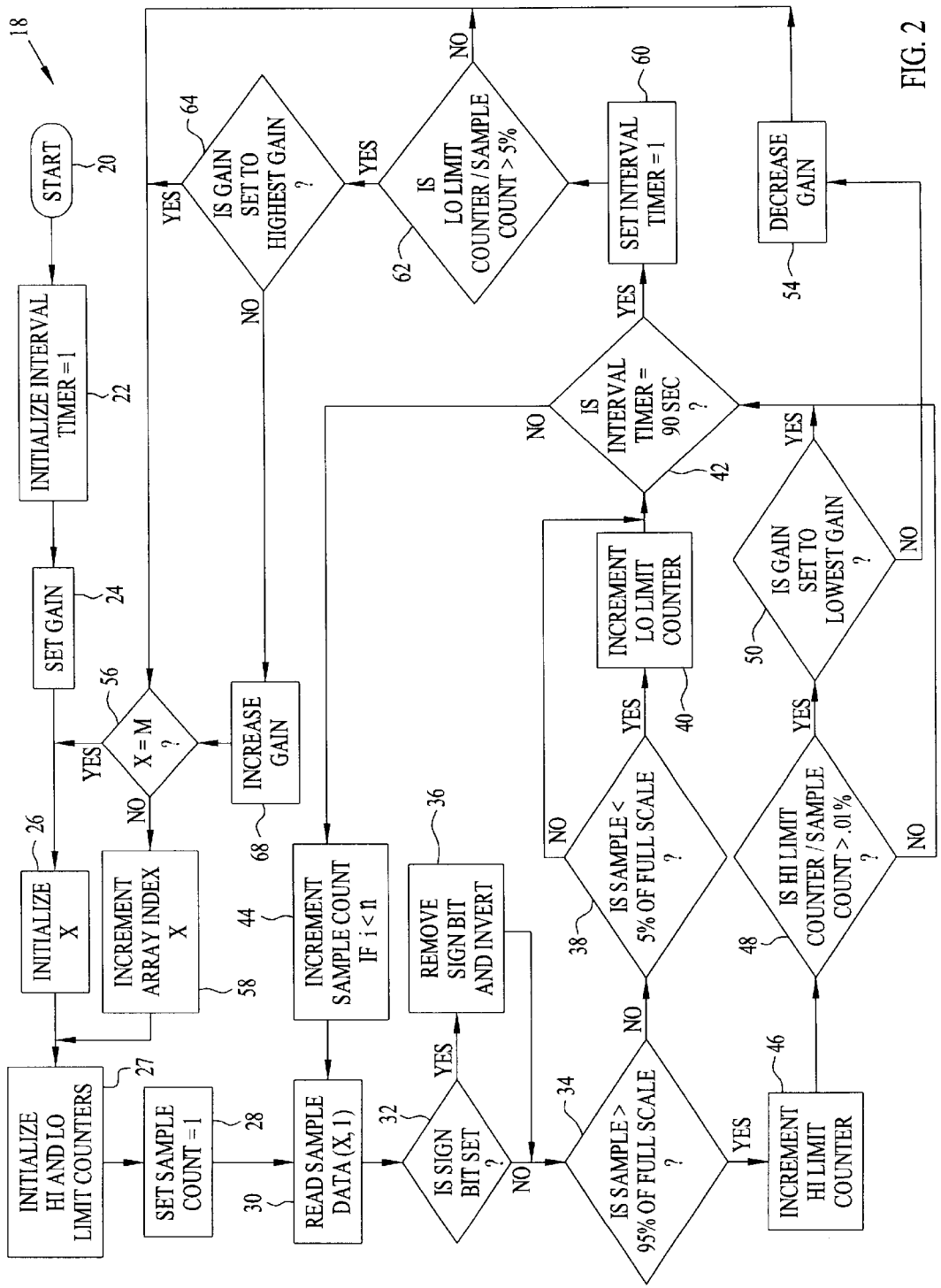
FIG. 2 is a flow chart that illustrates the logical operation of the digital hardware depicted in FIG. 1.

Still referring to FIG. 2, the invention may also be implemented wherein the digital hardware 10 executes an algorithm that performs the steps of: 1) generating a signal representing a gain level; 2) reading a set of digital data values $V_1, V_2, V_3, \ldots V_n$, where n is an integer; 3) determining a range of the digital data values; 4) initializing a sample counter index i; 5) counting a number j of the digital data values $V_1, \ldots V_i$ that exceed a predetermined high percent limit of the range, where $1 \leq i \leq n$; 6) determining an absolute value of the digital value $V_i$; 7) counting a number k of the digital data values $V_1, \ldots V_i$ that are less than a low percent limit of the range; 8) generating a signal that causes the gain level to be decreased if the absolute value of $V_i$ is greater than the high percent limit of the range, a ratio j/i exceeds a first threshold value, and the gain level is not set to a lowest gain level; 9) generating a signal that causes the gain level to be increased if the absolute value of $V_i$ is greater than a lower percentage of the maximum value, a ratio k/i exceeds a second threshold value, and the gain level is not set to a highest gain level; and 10) incrementing the sample counter index i and repeating steps (5)–(10) if the sample counter index i is less than n.

Obviously, many modifications and variations of the present invention are possible in light of the above teachings. For example, system 10 is described as implementing algorithm in hardware. However, algorithm 18 may also be executed in software. In such case, digital hardware 12 may be a programmable digital data processor which implements algorithm 18 as a software routine comprising a set of computer executable instructions. It is therefore to be understood that within the scope of the appended claims, the invention may be practiced otherwise than as specifically described.

What is claimed is:

1. An automatic gain control, comprising: digital hardware that executes an algorithm that performs the steps of:
   1) generating a signal representing a gain level;
   2) reading a set of digital data values $V_1, \ldots V_2, V_3, V_n$, where n is an integer;
   3) determining a range of said digital data values;
   4) initializing a sample counter index i;
   5) counting a number j of said digital data values $V_1, \ldots V_i$ that exceed a predetermined high percent limit of said range, where $1 \leq i \leq n$;
   6) determining an absolute value of said digital value $V_i$;
   7) counting a number k of said digital data values $V_1, \ldots V_i$ that are less than a low percent limit of said range;
   8) generating a signal that causes said gain level to be decreased if said absolute value of $V_i$ is greater than said high percent limit of said range, a ratio j/i exceeds a first threshold value, and said gain level is not set to a lowest gain level;
   9) generating a signal that causes said gain level to be increased if said absolute value of $V_i$ is greater than said low percent limit of said range, a ratio k/i exceeds a second threshold value, said gain level is not set to a highest gain level, and a predetermined time limit has elapsed; and
   10) incrementing said sample counter index i and repeating said steps (5)–(10) if said sample counter index i is less than n.

2. The automatic gain control of claim 1 wherein said algorithm is implemented in hardware.

3. The automatic gain control of claim 1 wherein said algorithm is implemented in software.

4. An automatic gain control, comprising: digital hardware that executes an algorithm that includes the steps of:
   1) issuing a gain level control instruction where a gain level is within the range of a lowest gain level to a highest gain level;
   2) initializing an array index x, a sample counter index i, a high limit counter index j, and a low limit counter index k, and an interval timer value;
   3) initializing a sample counter index n, where n is an integer;
   4) reading a digital data value V(x,i) from at least one array $A_x$ of arrays $A_1, A_2, A_3, \ldots A_m$, where each said array $A_x$ includes digital data values $\{V_{(x,1)}, V_{(x,2)}, V_{(x,3)}, \ldots V_{(x,n)}\}$, where x represents an index from 1 to m, m and n each are integers, and i is an index from 1 to n;
   5) determining if said digital data value $V_{(x,i)}$ is greater than a high percent limit of a range of said digital data values $\{V_{(x,1)}, V_{(x,2)}, V_{(x,3)}, \ldots V_{(x,n)}\}$;
   6) incrementing said high limit counter index j if the result at step (5) is YES;
   7) determining if j/i is greater than a first threshold value;
   8) determining if said gain level is equal to said lowest gain level;
   9) decreasing said gain level if the result of step (7) is YES, and the result of step (8) is NO;

10) determining if said interval timer value has reached a predetermined time limit;

11) incrementing said sample counter index i and then repeating steps (4)–(11) if the result of step (10) is NO;

12) determining if said digital data value $V_{(x,i)}$ is less than a low percent limit of said range;

13) repeating steps (10)–(13) if the result of step (12) is NO;

14) incrementing said low limit counter index k and then repeating steps (10)–(14) if the result of step (12) is YES;

15) resetting said interval timer value if the result of step (10) is YES and determining if a ratio k/i is greater than a second threshold value;

16) determining if said gain level is set to said highest gain level if the result of step (15) is YES;

17) increasing said gain level if the determination at step (16) is NO;

18) determining if there are more data arrays to process;

19) incrementing said index x if the determination at step (18) is NO; and 20) repeating steps (3)–(20).

5. The automatic gain control of claim 4 wherein said high percent limit is about ninety-five percent.

6. The automatic gain control of claim 4 wherein said low percent limit is about five percent.

7. The automatic gain control of claim 4 wherein said first threshold value is 0.01%.

8. The automatic gain control of claim 4 wherein said predetermined time limit represents no more than about ninety seconds.

9. The automatic gain control of claim 4 which further performs the step of determining the absolute value of $V_{(x,i)}$ before executing step (5).

10. An automatic gain control, comprising:

a programmable digital data processor for executing a set of instructions that includes the steps of:

1) issuing a gain level control instruction where a gain level is within the range of a lowest gain level to a highest gain level;

2) initializing an array index x, a sample counter index i, a high limit counter index j, and a low limit counter index k, and an interval timer value;

3) initializing a sample counter index n, where n is an integer;

4) reading a digital data value $V_{(x,i)}$ from at least one array $A_x$ of arrays $A_1, A_2, A_3, \ldots A_m$, where each said array $A_x$, includes digital data values $\{V_{(x,1)}, V_{(x,2)}, V_{(x,3)}, \ldots V_{(x,n)}\}$, where x represents an index from 1 to m, m and n each are integers, and i is an index from 1 to n;

5) determining if said digital data value $V_{(x,i)}$ is greater than a high percent limit of a range of said digital data values $\{V_{(x,1)}, V_{(x,2)}, V_{(x,3)}, \ldots V_{(x,n)}\}$;

6) incrementing said high limit counter index j if the result at step (5) is YES;

7) determining if j/i is greater than a first threshold value;

8) determining if said gain level is equal to said lowest gain level;

9) decreasing said gain level if the result of step (7) is YES, and the result of step (8) is NO;

10) determining if said interval timer value has reached a predetermined time limit;

11) incrementing said sample counter index i and then repeating steps (4)–(11) if the result of step (10) is NO;

12) determining if said digital data value $V_{(x,i)}$ is less than a low percent limit of said range;

13) repeating steps (10)–(13) if the result of step (12) is NO;

14) incrementing said low limit counter index k and then repeating steps (10)–(14) if the result of step (12) is YES;

15) resetting said interval timer value if the result of step (10) is YES and determining if a ratio k/i is greater than a second threshold value;

16) determining if said gain level is set to said highest gain level if the result of step (15) is YES;

17) increasing said gain level if the determination at step (16) is NO;

18) determining if there are more data arrays to process;

19) incrementing said index x if the determination at step (18) is NO; and 20) repeating steps (3)–(20).

11. The automatic gain control of claim 10 which further performs the step of determining the absolute value of $V_{(x,i)}$ before executing step (5).

* * * * *